(12) United States Patent
Yi

(10) Patent No.: US 9,461,088 B2
(45) Date of Patent: Oct. 4, 2016

(54) IMAGE SENSOR PIXEL WITH MULTIPLE STORAGE NODES

(71) Applicant: OMNIVISION TECHNOLOGIES, INC., Santa Clara, CA (US)

(72) Inventor: Xianmin Yi, Menlo Park, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 142 days.

(21) Appl. No.: 14/557,075

(22) Filed: Dec. 1, 2014

(65) Prior Publication Data

US 2016/0155768 A1 Jun. 2, 2016

(51) Int. Cl.
*H01L 27/146* (2006.01)
*H04N 5/3745* (2011.01)
*H04N 5/378* (2011.01)

(52) U.S. Cl.
CPC ... *H01L 27/14643* (2013.01); *H01L 27/14612* (2013.01); *H01L 27/14636* (2013.01); *H01L 27/14638* (2013.01); *H04N 5/378* (2013.01); *H04N 5/37452* (2013.01); *H04N 5/37455* (2013.01)

(58) Field of Classification Search
CPC .................. H01L 27/14643; H01L 27/14638; H01L 27/14612; H01L 27/14636; H04N 5/37452; H04N 5/378; H04N 5/37455
USPC ..................................................... 250/208.1
See application file for complete search history.

(56) References Cited

U.S. PATENT DOCUMENTS

| | | | |
|---|---|---|---|
| 4,611,140 A * | 9/1986 | Whitlock | ........... H03H 9/02976 310/313 B |
| 7,749,798 B2 | 7/2010 | Rhodes et al. | |
| 7,781,718 B2 | 8/2010 | Rhodes | |
| 8,089,036 B2 | 1/2012 | Manabe | |
| 8,471,315 B1 * | 6/2013 | Hynecek | ........... H01L 27/14603 257/233 |
| 8,773,562 B1 * | 7/2014 | Fan | .................. H01L 27/14643 250/208.1 |

(Continued)

FOREIGN PATENT DOCUMENTS

| | | |
|---|---|---|
| CN | 103905748 A | 7/2014 |
| TW | 201301488 A | 1/2013 |

(Continued)

OTHER PUBLICATIONS

TW Patent Application No. 104139994—Taiwanese Office Action and Search Report, issued Aug. 10, 2016, with English Translation, 21 pages.

*Primary Examiner* — Seung C Sohn
(74) *Attorney, Agent, or Firm* — Blakely Sokoloff Taylor & Zafman LLP

(57) ABSTRACT

An image sensor pixel includes a photodiode, a first storage node, a second storage node, a first transfer storage gate, a second transfer storage gate, a floating diffusion, and an output gate. The photodiode is for generating image charge in response to image light. The first storage node, the second storage node, and the photodiode have a first doping polarity. The first transfer storage gate is coupled to transfer the image charge from the photodiode to the first storage node. The first transfer storage gate is disposed over a majority portion of the first storage node. The second transfer storage gate is coupled to transfer the image charge from the first storage node to the second storage node. The second transfer storage gate is disposed over a majority portion of the second storage node. The output gate transfers the image charge from the second storage node to the floating diffusion.

18 Claims, 4 Drawing Sheets

(56) References Cited

U.S. PATENT DOCUMENTS

| | | |
|---|---|---|
| 8,946,795 B2 | 2/2015 | Chen et al. |
| 9,170,421 B2 | 10/2015 | Shi et al. |
| 2014/0252201 A1 | 9/2014 | Li et al. |
| 2014/0299956 A1 | 10/2014 | Hsiung et al. |
| 2014/0346572 A1 | 11/2014 | Chen et al. |

FOREIGN PATENT DOCUMENTS

| | | |
|---|---|---|
| TW | 201433822 A | 9/2014 |
| WO | WO 2007/024582 A1 | 3/2007 |

* cited by examiner

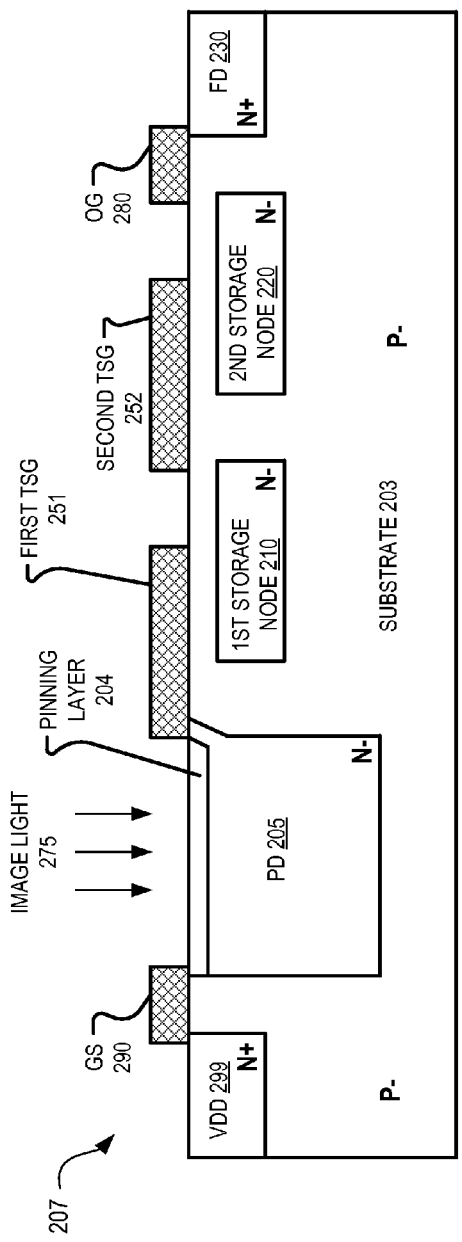
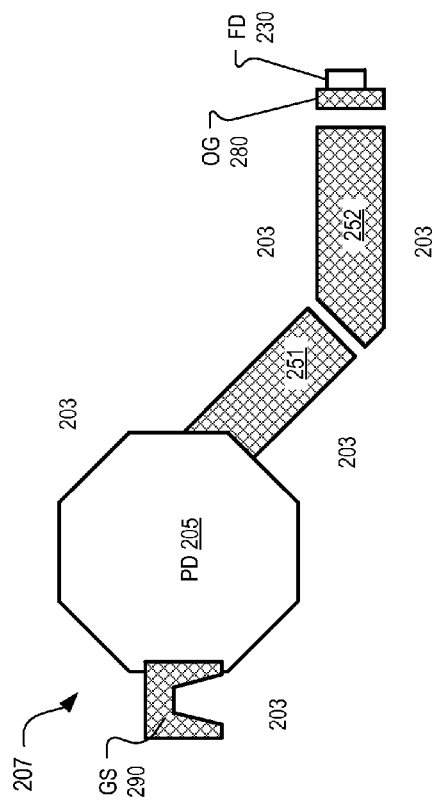
FIG. 2A
FIG. 2B

IMAGE SENSOR PIXEL WITH MULTIPLE STORAGE NODES

TECHNICAL FIELD

This disclosure relates generally to image sensors, and in particular but not exclusively, relates to image sensor including pixels with multiple storage nodes.

BACKGROUND INFORMATION

Image sensors are widely used in digital still cameras, cellular phones, security cameras, medical devices, and automobiles. As the applications for image sensors increases, demand increases for image sensors with increased image quality and improved performance. Complementary metal-oxide-semiconductor ("CMOS") technology is used to manufacture lower cost image sensors on silicon substrates. Some CMOS image sensors are designed for capturing high dynamic range ("HDR") images.

The size of image sensors is also shrinking, even as consumers desire increasing performance and functionality. Therefore, designers must balance adding features to image sensor with the overall size of the image sensor. To add HDR capability to image sensors, some designers have used two photodiodes in a combination pixel to capture two different images at different light levels. One sub-pixel in a combination pixel can be used to sense bright light conditions while another sub-pixel in the combination pixel can be used to sense low light conditions. However, using two photodiodes has a large impact on available semiconductor real estate. Some image sensors generate HDR images by capturing consecutive images. However, readout time between capturing the consecutive images impacts the final HDR image, especially when a scene includes moving subjects. Other contexts, such as gesture recognition also place a premium on capturing consecutive images in short time periods.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

FIG. 2A is a cross-section illustration of an example pixel that includes multiple storage nodes, in accordance with an embodiment of the disclosure.

FIG. 2B is a plan view of a layout of an example pixel that includes multiple storage nodes, in accordance with an embodiment of the disclosure.

DETAILED DESCRIPTION

Embodiments of a system and method for capturing images with pixels having multiple storage nodes are described herein. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
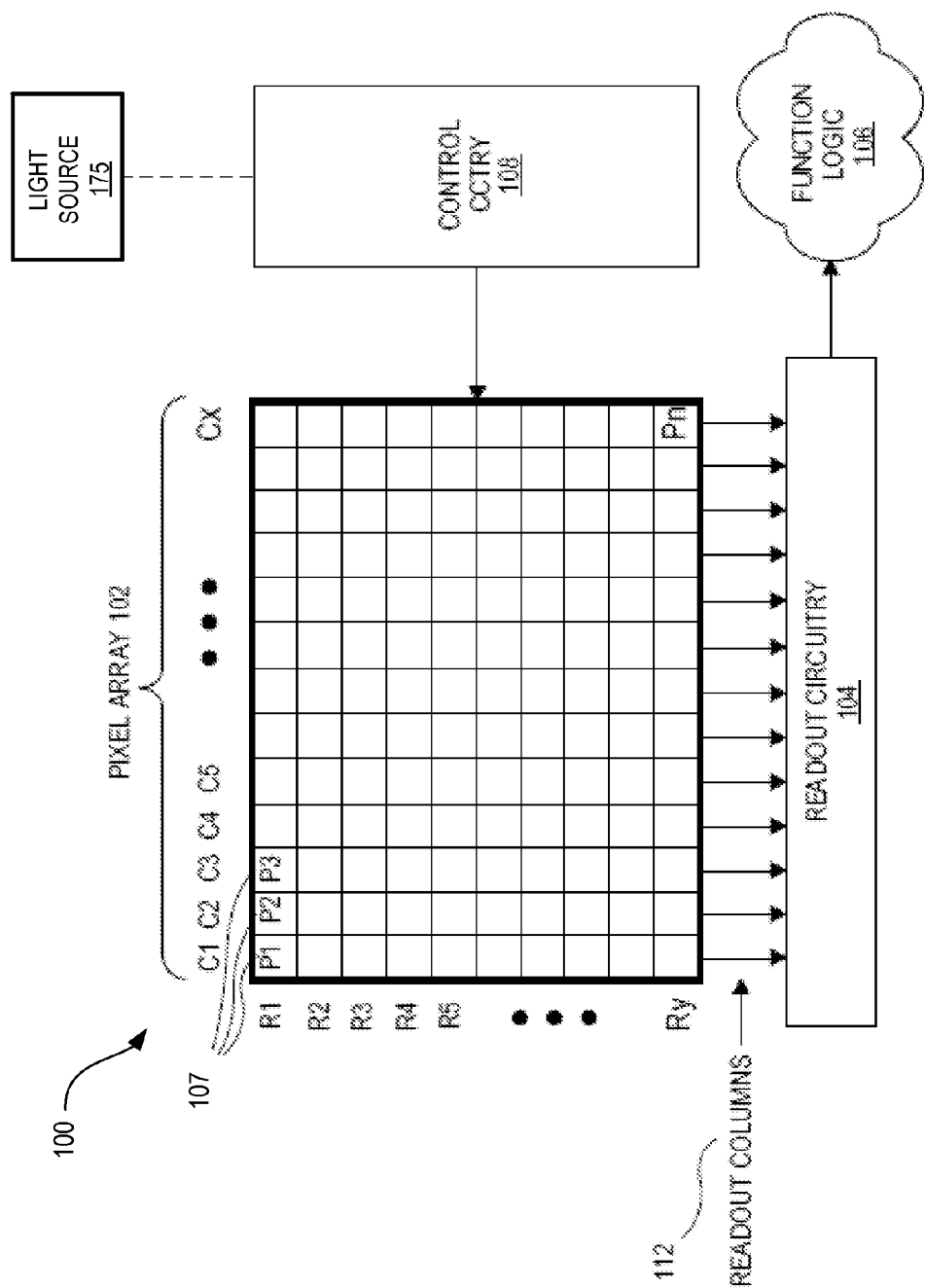
FIG. 1 is a block diagram schematic illustrating one example of an imaging system that includes a pixel array with pixels that have multiple storage nodes, in accordance with an embodiment of the disclosure.

FIG. 1 is a block diagram schematic illustrating one example of an imaging system 100, in accordance with an embodiment of the disclosure. Imaging system 100 includes an example pixel array 102, control circuitry 108, readout circuitry 104, and function logic 106. Pixel array 102 is coupled to control circuitry 108 and readout circuitry 104. Readout circuitry 104 is coupled to function logic 106.

In one example, pixel array 102 is a two-dimensional (2D) array of imaging sensors or pixels 107 (e.g., pixels P1, P2 . . . , Pn). In one example, each pixel 107 is a CMOS imaging pixel having multiple storage nodes. As illustrated, each pixel 107 is arranged into a row (e.g., rows R1 to Ry) and a column (e.g., column C1 to Cx) to acquire image data of a person, place, object, etc., which can then be used to render an image of the person, place, object, etc.

After each pixel 107 has acquired its image data or image charge, the image data is read out by readout circuitry 104 through readout columns 112 and then transferred to function logic 106. In various examples, readout circuitry 104 may include amplification circuitry, analog-to-digital (ADC) conversion circuitry, or otherwise. Function logic 106 may simply store the image data or even manipulate the image data by applying post image effects (e.g., crop, rotate, remove red eye, adjust brightness, adjust contrast, or otherwise). In one example, readout circuitry 104 may read out a row of image data at a time along readout column lines (illustrated) or may read out the image data using a variety of other techniques (not illustrated), such as a serial read out or a full parallel read out of all pixels simultaneously. The image charge generated by different photodiodes of pixel 107 may be read out separately during different time periods.

Control circuitry 108 is coupled to pixel array 102 to control operational characteristics of pixel array 102 in order to capture images generated by image light received by pixel array 102. For example, control circuitry 108 may generate a shutter signal for controlling image acquisition. In one example, the shutter signal is a global shutter signal for simultaneously enabling all pixels 107 within pixel array 102 to simultaneously capture their respective image data during a single acquisition window. In one embodiment, imaging system 100 includes a light source 175 that is coupled to illuminate a scene or a subject of a scene. Light source 175 generates non-visible light. In one embodiment, light source 175 includes an infrared light emitting diode ("LED"). In the illustrated embodiment, control circuitry 108 is coupled to control light source 175. Control circuitry may send light source 175 a light signal that causes light source 175 to emit a pulse of non-visible light to illuminate a scene or subject. Control circuitry 108 may be configured to synchronize the shutter signal and the pulse of non-visible light so that the pulse of non-visible light illuminates a scene or subject and pixels 107 of pixel array 102 capture the reflections of the pulse non-visible light from the scene or subject.

FIG. 2A is a cross-section illustration of an example pixel 207 that includes multiple storage nodes and FIG. 2B is a plan view of an example layout of pixel 207, in accordance with an embodiment of the disclosure. Pixel 207 can be used as pixels 107 in pixel array 102. Pixel 207 includes a global shutter ("GS") gate 290, a pinning layer 204, a photodiode 205, a first transfer storage gate ("TSG") 251, a first storage node 210, a second transfer storage gate ("TSG"), a second storage node 220, a output gate 280, and a floating diffusion 230. Pixel 207 is disposed within a substrate 203. Substrate 203 is a P doped semiconductor substrate in FIG. 2A. Photodiode 205, first storage node 210, second storage node 220, and floating diffusion 230 are doped opposite of substrate 203, which is N doped in FIG. 2A.

Figure 2C:
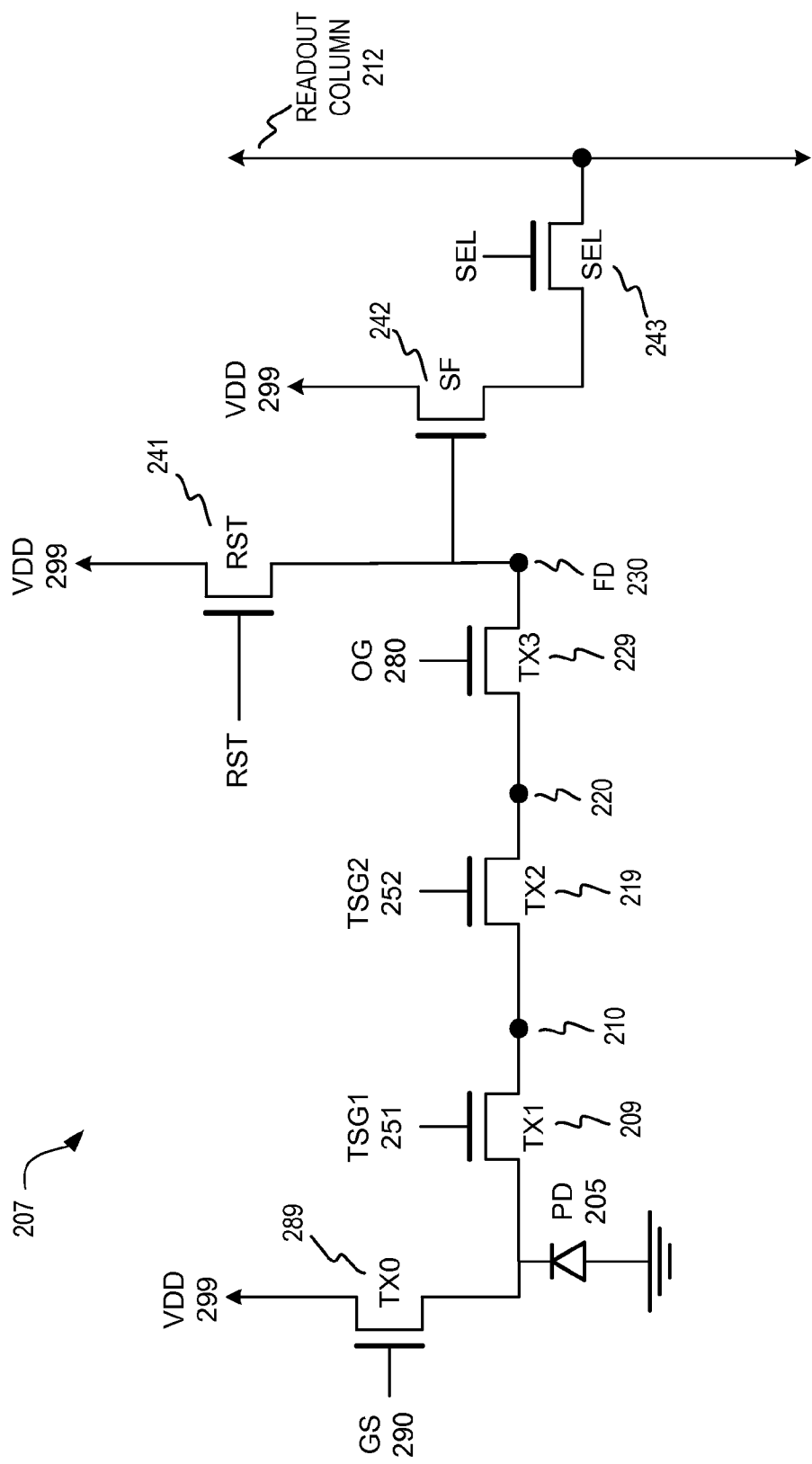
FIG. 2C is a schematic illustrating an electrical modeling of the example pixel of FIG. 2A, in accordance with an embodiment of the disclosure.

FIG. 2C is a schematic illustrating an electrical modeling of pixel 207, in accordance with an embodiment of the disclosure. Transistor TX0 289 includes global shutter gate 290. When TX0 289 is activated (e.g. by a digital high voltage on shutter gate 290), photodiode 205 is pre-charged to voltage $V_{DD}$ 299. Transistor TX1 209 includes first Transfer Storage Gate ("TSG") 251. When TX1 209 is activated (e.g. by a digital high voltage on TSG 251), image charge generated by photodiode 205 is transferred to first storage node 210. Transistor TX2 219 includes second Transfer Storage Gate ("TSG") 252. When TX2 219 is activated (e.g. by a digital high voltage on TSG 252), image charge is transferred from first storage node 210 to second storage node 220. Transistor TX3 229 includes output gate 280. When TX3 229 is activated (e.g. by a digital high voltage on output gate 280), image charge is transferred from second storage node 220 to floating diffusion 230.

Source follower SF transistor 242 amplifies the image signal generated by the image charge within floating diffusion 230 and row select transistor SEL 243 is activated to bring the amplified image signal onto readout column 212 for readout. To reset floating diffusion 230 to voltage VDD 299, reset transistor 241 is activated. Pixel 207 may perform a readout technique known as Correlated Double Sampling ("CDS") by resetting floating diffusion 230 and reading out the reset floating diffusion to establish a baseline readout and then subtracting the baseline readout from the image signal to generate a noise-corrected image signal.

Photodiode 205 is configured to generate image charge in response to receiving image light 275. In FIG. 2A, a P doped pinning layer 204 is disposed above photodiode 205 to form a pinned photodiode. Also in FIG. 2A, first TSG 251 is disposed over a majority portion of the first storage node 210 and second TSG 252 is disposed over a majority portion of the second storage node 220. First TSG 251 and second TSG 252 may be referred to as cascading transfer storage gates due to their serial nature and directly adjacent proximity. This configuration allows pixel 207 to operate in unique operating modes while also reducing the pixel area required to perform the unique operating modes.

Figure 3:
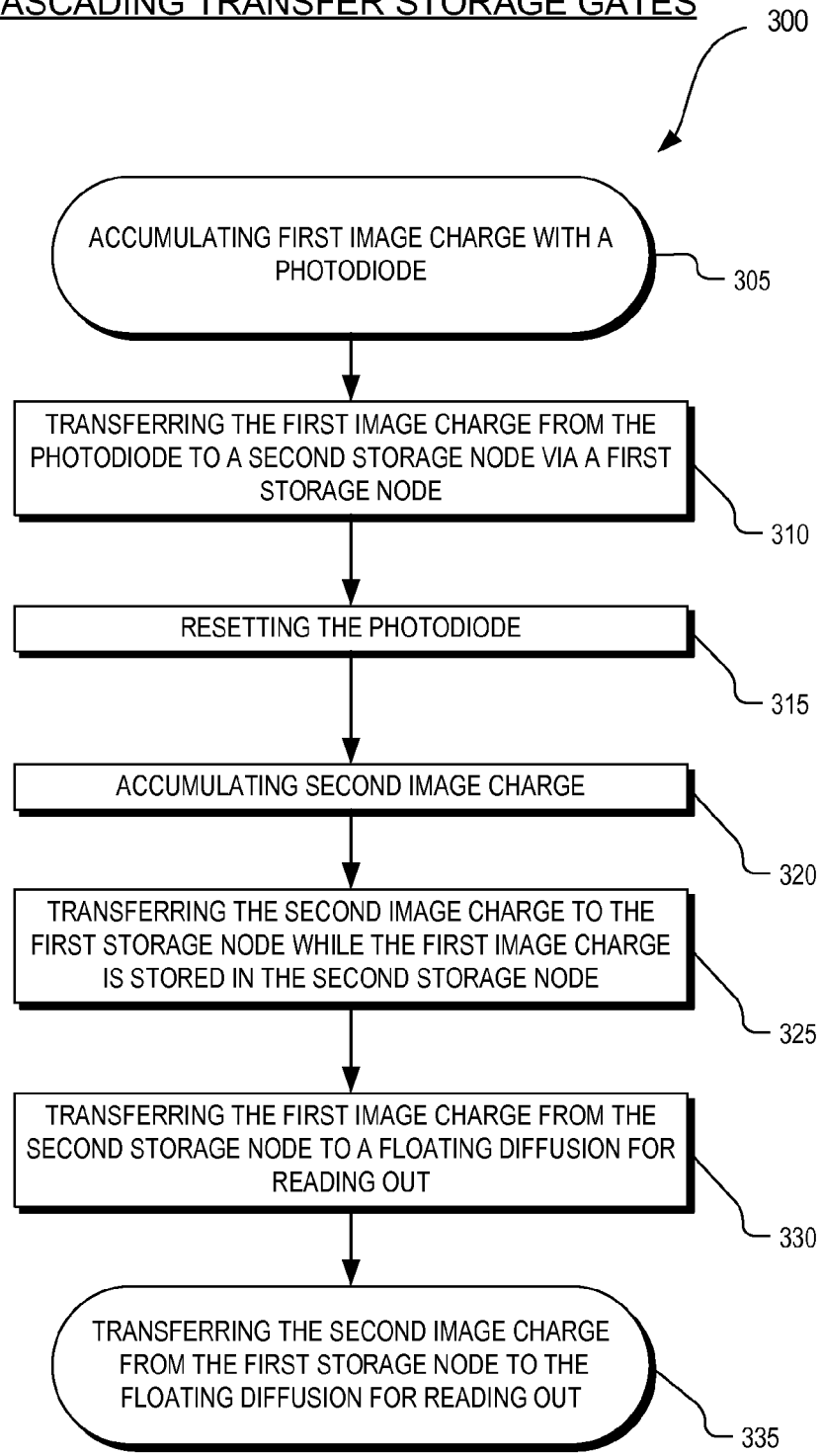
FIG. 3 is an example method of operating a pixel with multiple storage nodes, in accordance with an embodiment of the disclosure.

FIG. 3 is an example process 300 of operating pixel 207, in accordance with an embodiment of the disclosure. The order in which some or all of the process blocks appear in process 300 should not be deemed limiting. Rather, one of ordinary skill in the art having the benefit of the present disclosure will understand that some of the process blocks may be executed in a variety of orders not illustrated, or even in parallel.

In a process block 305, a first image charge is accumulated in photodiode 205. A global shutter signal may activate TX0 289 via global shutter gate 290 to pre-charge photodiode 205 prior to this first accumulation period. After the first accumulation period, the first image charge is transferred from photodiode 205 to second storage node 220, in process block 310. To transfer the first image charge from photodiode 205 to second storage node 220, a positive voltage is applied to first TSG 251 to activate TX0 209 and transfer the image charge from the photodiode 205 to first storage node 210. Then, a negative voltage is applied to first TSG 251 while a positive voltage is applied to second TSG 252 to activate TX2 219 to transfer the first image charge from first storage node 210 to second storage node 220. After enough time has passed to allow the first image charge to transfer to second storage node 220, a negative voltage is applied to second TSG 252 to trap and store the first image charge under second TSG 252 within second storage node 220.

In process block 315, photodiode 205 is reset by the global shutter gate 290 being activated, which pre-charges photodiode 205 back to voltage VDD 299. After photodiode 205 is reset, it begins accumulating second image charge during a second accumulation period (process block 320). After the second accumulation period, the second image charge is transferred to first storage node 210 by activating TX1 209 via first TSG 251 (process block 325). After enough time has passed to allow the second image charge to transfer to first storage node 210, a negative voltage is applied to first TSG 251 to trap and store the second image charge under first TSG 251 within first storage node 200. Hence, pixel 207 is capable of generating the first image charge during a first accumulation period and storing that first image charge in second storage node 220 while also generating the second image charge with photodiode 205 during a second accumulation period and storing that second image charge in first storage node 210. This allows pixel 207 to rapidly capture image signals from two different exposures (e.g. first accumulation period and second accumulation period) without being limited by the speed of a readout sequence to capture two different exposures. Furthermore, pixel 207 can capture the two image signals with a single photodiode 205 and a reduced transistor count compared with having two separate pixels. This reduced transistor count allows for increased photodiode area (and therefore increased Quantum Efficiency) and decreased transistor area in pixel array 102, which improves the imaging capability of image sensor 100.

Before reading out pixel 207, a negative voltage may be applied to both first TSG 251 and second TSG 252 while the first image charge is stored in second storage node 220 and while the second image charge is stored in first storage node 210. Photodiode 205 may generate third image charge in response to third image light while the first and second image charge are stored within pixel 207 to be readout. It is understood that a third cascading transfer storage gate may be added in series with first TSG 251 and second TSG to add capability to store third image charge from a third accumulation period.

To readout pixel 207, the first image charge is transferred from second storage node 220 to floating diffusion 230 in process block 330 for reading out using transistors 241, 242, and 243, as described above. As described above, CDS may be performed by sampling a baseline readout from floating diffusion 230 to establish a baseline signal from pixel 207. Notably, CDS can still be implemented using pixel 207 by resetting floating diffusion 230 while still holding both the first and second image charge under first TSG 251 and second TSG 252, respectively.

After process block 330, the second image charge is transferred from first storage node 210 to floating diffusion 230 in process block 335. The second image charge flows through second storage node 220 during transfer to floating diffusion 230. TX2 219 is activated via second TSG 252 to transfer the second image charge from first storage node 210 to second storage node 220 and TX3 229 is activated via output gate 280 to transfer the second image charge from second storage node 220 to floating diffusion 230. TX2 219 and TX3 229 may be activated simultaneously to expedite transfer of the second image charge to floating diffusion 230.

Referring again to FIG. 2A, first storage node 210 is illustrated as being buried in substrate 203 so that a layer of P doped substrate is disposed between first storage node 210 and first TSG 251. Similarly, second storage node 220 is illustrated as being buried in substrate 203 so that a layer of P doped substrate is disposed between second storage node 220 and second TSG 252. Since the respective image charges are stored in their respective storage nodes which are buried storage nodes, the stored image charge is less susceptible to being affected by dark current that runs along the interface between substrate 203 and an insulation layer (not illustrated) isolating the gates of TX1 209, TX2 219, and TX3 229 from substrate 203. In contrast, pixels of Charge-Coupled Devices ("CCDs") for example do not effectively store image charge under their gates as the image charge dissipates due to dark current. Applying negative voltages to first TSG 251 and second TSG 252 while image charge is stored under the gates may also preserve the image charge under first TSG 251 and second TSG 252 as the negative gate voltages drive the image charge (in the form of electrons) away from dark current at the substrate-insulation layer interface. Having first TSG 251 disposed over a large portion (at least a majority portion) of first storage node 210 allows the negative voltage applied to first TSG 251 to have more influence on the location of the second image charge stored in first storage node 210. Similarly, having second TSG 252 disposed over a large portion (at least a majority portion) of second storage node 220 allows the negative voltage applied to second TSG 252 to have more influence on the location of the second image charge stored in second storage node 220.

The features of pixel 207 can be utilized capturing HDR images where the first image charge (captured during a first accumulation period) in pixels 207 of pixel array 102 are used to create a first image and where the second image charge (captured during a second subsequent accumulation period) in pixels 207 of array 102 are used to create a second image. Then an HDR image can be generated using the first and second image. As such, the first accumulation period and the second accumulation period may have differing durations to capture different exposures to generate an HDR image. Advantageously, the first and second image charges can be captured with very little time in between the first and second accumulation period since pixel 207 can store the first and second image charge within pixel 207 without being limited by the speed of readout circuity 104 to capture subsequent images.

In addition to capturing common HDR images, pixel 207 can be utilized to generate infrared illuminated HDR images. Infrared illuminated HDR images have application in automobile and surveillance imaging contexts, for example. To generate an infrared illuminated HDR image with image system 100, light source 175 emits a first pulse of infrared light to illuminate a scene or subject. Control circuitry 108 initiates a first global shutter to pixels 107 to capture the first pulse of infrared light reflected by the scene in a first exposure period. The infrared light from the first pulse that is reflected by the scene is first image light. Control circuitry 108 is coupled to light source 175 to generate the first pulse of infrared light and coupled to generate the first global shutter signal (which momentarily activates the global shutter transistors TX0 289 to reset photodiodes 205) in synchronization with generating the first pulse of infrared light to capture the first image light. Then, light source 175 generates a second infrared light pulse to be reflected by the scene or subject of the scene. Control circuitry 108 initiates a second global shutter to pixels 107 to capture the second pulse of infrared light reflected by the scene in a second exposure period. The infrared light from the second pulse that is reflected by the scene is second image light. Control circuitry 108 is coupled to light source 175 to generate the second pulse of infrared light and coupled to generate the second global shutter signal (which momentarily activates the global shutter transistors TX0 289 to reset photodiodes 205) in synchronization with generating the second pulse of infrared light to capture the second image light.

The first infrared pulse and the second infrared pulse may have differing intensities. The first infrared pulse and the second infrared pulse may also have differing durations. The duration of the first exposure period for capturing the first image light and the duration of the second exposure period for capturing the second image light may correspond to the duration of the first and second infrared pulses, respectively.

Pixel 207 generates first image charge in response to the first image light from the first infrared light pulse and generates second image charge in response to the second image light from the second infrared light pulse. The first image charge is transferred to second storage node 220 of pixels 207 for storage, as described above. Similarly, the second image charge can be transferred to first storage node 210 for storage. Storage of the first and second image charge within pixels 207 allows for very short time periods between the first exposure period and second exposure period, thus reducing the motion artifact between the first and second infrared illuminated images. Readout of the first image charge and the second image charge from pixel 207 can also be performed in accordance with embodiments of the disclosure to generate first and second infrared illuminated images for generation of an infrared illuminated HDR image.

Pixels 207 in pixel array 102 can also be utilized to generate ambient light adjusted images in gesture recognition contexts. To generate an ambient light adjusted image with image system 100, light source 175 emits a first pulse of infrared light to illuminate a scene or subject. Control circuitry 108 initiates a first global shutter to the pixels 207 to capture the first pulse of infrared light reflected by the scene in a first exposure period. The infrared light from the first pulse that is reflected by the scene is first image light. Control circuitry 108 is coupled to light source 175 to generate the first pulse of infrared light and coupled to generate the first global shutter signal (which momentarily activates the global shutter transistors TX0 289 to reset photodiodes 205) in synchronization with generating the first pulse of infrared light to capture the first image light. The first image light includes both the infrared light from the infrared pulse and the ambient light from the scene.

In the second exposure following the first exposure period, no infrared light is emitted from light source 175 and control circuitry 108 initiates a second global shutter to pixels 107 to capture just the ambient light from the scene as second image light for a second image. The second exposure period is for the same duration as the first exposure period. To generate an ambient light adjusted image, the first image is subtracted by the second image to eliminate the ambient light in the scene, leaving only the infrared image. Isolating the infrared light in the scene in an ambient light adjusted image helps image recognition algorithms better determine gestures inputs in strong ambient light environments. An image sensor that includes pixels 207 is especially useful in gesture recognition contexts since pixel 207 is able to capture two sequential images with very little time in between the first and second exposure periods, which reduces motion blur artifacts and improves gesture recognition clarity.

The processes explained above are described in terms of computer software and hardware. The techniques described may constitute machine-executable instructions embodied within a tangible or non-transitory machine (e.g., computer) readable storage medium, that when executed by a machine will cause the machine to perform the operations described. Additionally, the processes may be embodied within hardware, such as an application specific integrated circuit ("ASIC") or otherwise.

A tangible non-transitory machine-readable storage medium includes any mechanism that provides (i.e., stores) information in a form accessible by a machine (e.g., a computer, network device, personal digital assistant, manufacturing tool, any device with a set of one or more processors, etc.). For example, a machine-readable storage medium includes recordable/non-recordable media (e.g., read only memory (ROM), random access memory (RAM), magnetic disk storage media, optical storage media, flash memory devices, etc.).

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. An image sensor pixel comprising:
    a photodiode for generating image charge in response to image light;
    a first storage node;
    a second storage node, wherein the first storage node, the second storage node, and the photodiode have a first doping polarity;
    a first transfer storage gate ("TSG") coupled to transfer the image charge from the photodiode to the first storage node, wherein the first TSG is disposed over a majority portion of the first storage node;
    a second TSG coupled to transfer the image charge from the first storage node to the second storage node, wherein the second TSG is disposed over a majority portion of the second storage node;
    a floating diffusion; and
    an output gate coupled to transfer the image charge from the second storage node to the floating diffusion.

2. The image sensor pixel of claim 1, wherein the second storage node and the second TSG are coupled to store the image charge under the second TSG while additional image charge is generated by the photodiode in response to additional image light, and wherein the first storage node and the second TSG are coupled to store the additional image charge under the first TSG while the image charge is stored under the second TSG.

3. The image sensor pixel of claim 1, wherein the first and second storage nodes are buried in a substrate of a second doping polarity such that a layer of the second doping polarity is disposed between the first storage node and the first TSG and disposed between the second storage node and the second TSG, the first doping polarity being opposite the second doping polarity.

4. The image sensor pixel of claim 1 further comprising:
    a reset transistor coupled to reset the floating diffusion; and
    a source follower transistor to transfer floating diffusion charge from the floating diffusion to a readout line.

5. The image sensor pixel of claim 1 further comprising:
    a global shutter gate coupled to selectively reset the photodiode.

6. An imaging system comprising:
    a light source coupled to emit non-visible light;
    an image sensor having a pixel array, wherein each image sensor pixel includes:
        a photodiode for generating image charge in response to image light;
        a shutter transistor coupled to reset the photodiode;
        a first storage node;
        a second storage node, wherein the first storage node, the second storage node, and the photodiode have a first doping polarity;
        a first transfer storage gate ("TSG") coupled to transfer the image charge from the photodiode to the first storage node, wherein the first TSG is disposed over a majority portion of the first storage node;
        a second TSG coupled to transfer the image charge from the first storage node to the second storage node, wherein the second TSG is disposed over a majority portion of the second storage node;
        a floating diffusion; and
        an output gate coupled to transfer the image charge from the second storage node to the floating diffusion; and
    a controller coupled to the light source to generate a pulse of the non-visible light and coupled to activate the shutter transistors to reset the photodiodes in synchronization with generating the pulse of the non-visible light.

7. The imaging system of claim 6, wherein the second storage node and the second TSG are coupled to store the image charge under the second TSG while additional image charge is generated by the photodiode in response to additional image light, and wherein the first storage node and the second TSG are coupled to store the additional image charge under the first TSG while the image charge is stored under the second TSG.

8. The imaging system of claim 6, wherein the first and second storage nodes are buried in a substrate of a second doping polarity such that a layer of the second doping polarity is disposed between the first storage node and the first TSG and disposed between the second storage node and the second TSG, the first doping polarity being opposite the second doping polarity.

9. The imaging system of claim 6 further comprising:
a reset transistor coupled to reset the floating diffusion; and
a source follower transistor to transfer floating diffusion charge from the floating diffusion to a readout line.

10. A method of capturing an image, wherein each image sensor pixel in an array of image sensor pixel executes a method comprising:
accumulating a first image charge with a photodiode in response to first image light;
transferring the first image charge from the photodiode to a second storage node, wherein the first image charge flows through a first storage node during transfer to the second storage node;
resetting the photodiode with a global shutter signal after transferring the first image charge to the second storage node;
accumulating a second image charge with the photodiode in response to second image light, wherein accumulating the second image charge occurs after resetting the photodiode;
transferring the second image charge to the first storage node while the first image charge is stored in the second storage node;
transferring the first image charge from the second storage node to a floating diffusion for reading out, wherein the second storage node is coupled between the first storage node and the floating diffusion; and
transferring the second image charge from the first storage node to the floating diffusion for reading out, wherein the second image charge flows through the second storage node during transfer to the floating diffusion.

11. The method of claim 10, wherein a negative voltage is applied to a first transfer storage gate ("TSG") and a positive voltage is applied to a second TSG while the first image charge is transferred from the photodiode to the second storage node, wherein the first TSG is coupled to transfer the first image charge from the photodiode to the first storage node, and wherein second TSG is coupled to transfer the second image charge from the second storage node to the floating diffusion.

12. The method of claim 10, wherein a negative voltage is applied to a first transfer storage gate ("TSG") and a positive voltage is applied to a second TSG while the first image charge is transferred from the first storage node to the floating diffusion, wherein the first TSG is coupled to transfer the first image charge from the photodiode to the first storage node, and wherein second TSG is coupled to transfer the second image charge from the second storage node to the floating diffusion.

13. The method of claim 10 further comprising:
applying a negative voltage to a first transfer storage gate ("TSG") and a second storage gate after transferring the second image charge to the first storage node and before transferring the first image charge from the second storage node to the floating diffusion, wherein the first TSG is coupled to transfer the first image charge from the photodiode to the first storage node, and wherein second TSG is coupled to transfer the second image charge from the second storage node to the floating diffusion.

14. The method of claim 13, wherein the first TSG is disposed over a majority portion of the first storage node, and wherein the second TSG is disposed over a majority portion of the second storage node.

15. The method of claim 10 further comprising:
generating a first non-visible light pulse to be reflected by a scene as the first image light; and
generating a second non-visible light pulse to be reflected by the scene as the second image light, wherein the first non-visible light pulse and the second non-visible light pulse have different intensities.

16. The method of claim 10 further comprising:
generating a first non-visible light pulse to be reflected by a scene as the first image light;
subtracting a representation of the second image charge from a representation of the first image charge to generate an image without an ambient light contribution.

17. The method of claim 10 further comprising:
generating a first non-visible light pulse to be reflected by a scene as the second image light; and
subtracting a representation of the first image charge from a representation of the second image charge to generate an image without ambient light.

18. The method of claim 10 further comprising:
applying a negative voltage to both a first transfer storage gate ("TSG") and a second TSG between transferring the second image charge to the first storage node and transferring the first image charge to the floating diffusion.

* * * * *